United States Patent
Lee et al.

(10) Patent No.: US 11,139,841 B2
(45) Date of Patent: Oct. 5, 2021

(54) APPARATUS AND METHOD FOR GENERATING OSCILLATING SIGNAL IN WIRELESS COMMUNICATION SYSTEM

(71) Applicant: Samsung Electronics Co., Ltd., Suwon-si (KR)

(72) Inventors: Jooseok Lee, Suwon-si (KR); Woojae Lee, Suwon-si (KR); Daeyoung Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 15/733,343

(22) PCT Filed: Dec. 11, 2018

(86) PCT No.: PCT/KR2018/015667
§ 371 (c)(1),
(2) Date: Jul. 2, 2020

(87) PCT Pub. No.: WO2019/135503
PCT Pub. Date: Jul. 11, 2019

(65) Prior Publication Data
US 2020/0389191 A1    Dec. 10, 2020

(30) Foreign Application Priority Data
Jan. 8, 2018 (KR) .................. 10-2018-0002112

(51) Int. Cl.
*H04B 1/04* (2006.01)
*H03L 7/08* (2006.01)
*H03L 7/099* (2006.01)

(52) U.S. Cl.
CPC .............. *H04B 1/04* (2013.01); *H03L 7/099* (2013.01)

(58) Field of Classification Search
CPC .......... H04B 1/04; H04B 1/0475; H04B 1/16; H04B 1/40; H04B 10/697; H04B 1/0483;
(Continued)

(56) References Cited

U.S. PATENT DOCUMENTS

| | | | |
|---|---|---|---|
| 5,809,409 A | 9/1998 | Itoh et al. | |
| 9,130,610 B1 * | 9/2015 | Maeda | ............... H04L 27/2089 |

(Continued)

FOREIGN PATENT DOCUMENTS

| | | |
|---|---|---|
| EP | 2885871 A1 | 6/2015 |
| JP | H06-268451 | 9/1994 |

(Continued)

OTHER PUBLICATIONS

International Search Report and Written Opinion of the International Searching Authority in connection with International Application No. PCT/KR2018/015667 dated Mar. 26, 2019, 10 pages.

(Continued)

*Primary Examiner* — Quochien B Vuong

(57) ABSTRACT

The present disclosure relates to a pre-$5^{th}$-Generation (5G) or 5G communication system to be provided for supporting higher data rates beyond $4^{th}$-Generation (4G) communication system such as long-term evolution (LTE). According to various embodiments of the present disclosure, an apparatus of a transmitter in a wireless communication system may include an oscillating circuit for providing an oscillating signal, and a radio frequency (RF) circuit for converting a frequency of a transmit signal using the oscillating signal, and transmitting the transmit signal. The oscillating circuit may generate a base oscillating signal of a differential signal form, by multiplying a first signal and a second signal which constitute the different signal, generate a first signal set from the first signal and a second signal set from the second signal, and generate a signal in which at least one harmonic (Continued)

component adjacent to an intended frequency component is suppressed using the first signal set and the second signal set.

11 Claims, 13 Drawing Sheets

(58) Field of Classification Search
CPC ......... H04B 1/0082; H04B 15/00; H03L 7/08; H03L 7/093; H03L 7/099; H03L 2207/06; H03L 7/06; H03L 7/18; H03L 7/24
See application file for complete search history.

(56) References Cited

U.S. PATENT DOCUMENTS

| | | | | |
|---|---|---|---|---|
| 9,197,257 | B2* | 11/2015 | Axholt | H04B 1/0475 |
| 9,548,774 | B2* | 1/2017 | Lin | H04B 1/1018 |
| 10,447,203 | B2* | 10/2019 | Moon | H03B 5/1218 |
| 10,686,474 | B1* | 6/2020 | Ben-Yishay | H04B 1/0082 |
| 2004/0257129 | A1 | 12/2004 | Kwok | |
| 2007/0099590 | A1 | 5/2007 | Okabe et al. | |
| 2011/0095792 | A1 | 4/2011 | Bao | |
| 2011/0187420 | A1 | 8/2011 | Kuo et al. | |
| 2012/0319745 | A1* | 12/2012 | Ito | H03B 19/14 327/119 |
| 2014/0139274 | A1 | 5/2014 | Lee et al. | |
| 2014/0241335 | A1* | 8/2014 | Chen | H03L 7/093 370/342 |

FOREIGN PATENT DOCUMENTS

| | | |
|---|---|---|
| JP | H07-94943 | 4/1995 |
| KR | 20-0236179 Y1 | 9/2001 |
| WO | 2011104802 A1 | 9/2011 |
| WO | 2014029413 A1 | 2/2014 |

OTHER PUBLICATIONS

Supplementary European Search Report in connection with European Application No. 18898410.8 dated Dec. 2, 2020, 10 pages.
Piernas, Belinda, et al., "Analysis of Balanced Active Doubler for Broad-Band Operation—The Frequency-Tuning Concept," IEEE Transactions on Microwave Theory and Techniques, vol. 50, No. 4, Apr. 2002, 7 pages.
Puyal, Vincent, et al., "DC-100-GHz Frequency Doublers in InP DHBT Technology," IEEE Transactions on Microwave Theory and Techniques, vol. 53, No. 4, Apr. 2005, 7 pages.

* cited by examiner

APPARATUS AND METHOD FOR GENERATING OSCILLATING SIGNAL IN WIRELESS COMMUNICATION SYSTEM

CROSS-REFERENCE TO RELATED APPLICATIONS

This application is a 371 National Stage of International Application No. PCT/KR2018/015667, filed Dec. 11, 2018, which claims priority to Korean Patent Application No. 10-2018-0002112, filed Jan. 8, 2018, the disclosures of which are herein incorporated by reference in their entirety.

BACKGROUND

1. Field

The present disclosure relates generally to a wireless communication system, and more specifically, to an apparatus and a method for generating an oscillating signal in the wireless communication system.

2. Description of Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'beyond 4G network' or a 'post long term evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

For communication in a high frequency band as in the 5G system, a terminal or a base station transmits data using a carrier wave of a high frequency. For doing so, an oscillator included in the transmitter needs to generate a high-frequency oscillating signal. Accordingly, various methods for effectively generating the oscillating signal of the high frequency are studied.

SUMMARY

Based on the discussions described above, the present disclosure provides an apparatus and a method for effectively generating an oscillating signal of a high frequency in a wireless communication system.

In addition, the present disclosure provides an apparatus and a method for generating an oscillating signal of an intended frequency using a frequency multiplier in a wireless communication system.

In addition, the present disclosure provides an apparatus and a method for suppressing an unnecessary adjacent harmonic component generated by a frequency multiplier in a wireless communication system.

According to various embodiments of the present disclosure, an apparatus of a transmitter in a wireless communication system may include an oscillating circuit for providing an oscillating signal, and a radio frequency (RF) circuit for converting a frequency of a transmit signal using the oscillating signal, and transmitting the transmit signal. The oscillating circuit may generate a base oscillating signal of a differential signal form, by multiplying a first signal and a second signal which constitute the different signal, generate a first signal set from the first signal and a second signal set from the second signal, and generate a signal in which at least one harmonic component adjacent to an intended frequency component is suppressed using the first signal set and the second signal set.

According to various embodiments of the present disclosure, an operating method of a transmitter in a wireless communication system may include generating a base oscillating signal of a differential signal form, by multiplying a first signal and a second signal which constitute the different signal, generating a first signal set from the first signal and a second signal set from the second signal, and generating a signal in which at least one harmonic component adjacent to an intended frequency component is suppressed using the first signal set and the second signal set.

An apparatus and a method according to various embodiments of the present disclosure may effectively generate an oscillating signal of an intended frequency, by suppressing a harmonic component using a differential signal.

Effects obtainable from the present disclosure are not limited to the above-mentioned effects, and other effects which are not mentioned may be clearly understood by those skilled in the art of the present disclosure through the following descriptions.

DETAILED DESCRIPTION

Terms used in the present disclosure are used for describing particular embodiments, and are not intended to limit the scope of other embodiments. A singular form may include a plurality of forms unless it is explicitly differently represented. All the terms used herein, including technical and scientific terms, may have the same meanings as terms generally understood by those skilled in the art to which the present disclosure pertains. Among terms used in the present disclosure, the terms defined in a general dictionary may be interpreted to have the same or similar meanings with the context of the relevant art, and, unless explicitly defined in this disclosure, it shall not be interpreted ideally or excessively as formal meanings. In some cases, even terms defined in this disclosure should not be interpreted to exclude the embodiments of the present disclosure.

In various embodiments of the present disclosure to be described below, a hardware approach will be described as an example. However, since the various embodiments of the present disclosure include a technology using both hardware and software, the various embodiments of the present disclosure do not exclude a software-based approach.

Hereafter, the present disclosure relates to an apparatus and a method for generating an oscillating signal in a wireless communication system. Specifically, the present disclosure explains a technique for suppressing a harmonic component caused in generating the oscillating signal in the wireless communication system.

Terms indicating signals, terms indicating components of a circuit, terms indicating network entities, and terms indicating components of an apparatus, which are used in the following descriptions, are for the sake of explanations. Accordingly, the present disclosure is not limited to the terms to be described, and may use other terms having technically identical meaning.

In addition, the present disclosure describes various embodiments using terms used in some communication standards (e.g., 3rd generation partnership project (3GPP)), which are merely exemplary for explanations. Various embodiments of the present disclosure may be easily modified and applied in other communication systems.

Figure 1:
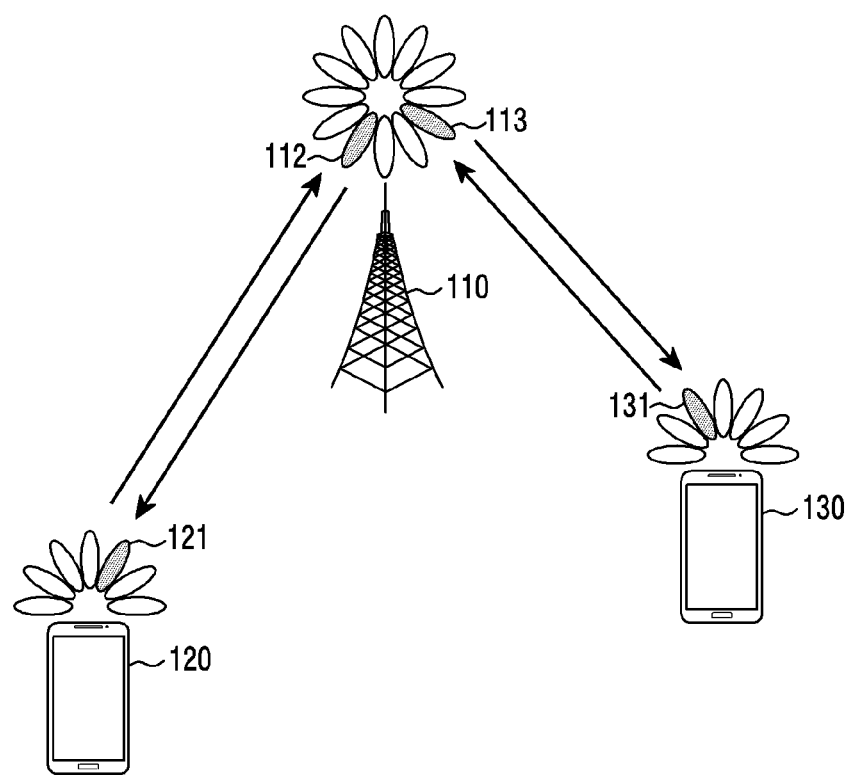
FIG. 1 illustrates a wireless communication system according to various embodiments of the present disclosure.

FIG. 1 illustrates a wireless communication system according to various embodiments of the present disclosure. FIG. 1 depicts a base station 110, a terminal 120, and a terminal 130, as some of nodes which use a radio channel in the wireless communication system. While FIG. 1 depicts only one base station, other base station which is identical or similar to the base station 110 may be further included.

The base station 110 is a network infrastructure for providing radio access to the terminals 120 and 130. The base station 110 has coverage defined as a specific geographical area based on a signal transmission distance. The base station 110 may be referred to as, besides the base station, an access point (AP), an eNodeB (eNB), a 5th generation node (5G node), a next generation nodeB (gNB), a wireless point, a transmission/reception point (TRP), or other terms having technically identical meaning.

The terminal 120 and the terminal 130 each are a device used by a user, and communicate with the base station 110 over a radio channel. In some cases, at least one of the terminal 120 and the terminal 130 may operate without user's involvement. That is, at least one of the terminal 120 and the terminal 130 is a device which performs machine type communication (MTC), and may not be carried by the user. The terminal 120 and the terminal 130 each may be referred to as, besides the terminal, a user equipment (UE), a mobile station, a subscriber station, a remote terminal, a wireless terminal, a user device, or other term having a technically equivalent meaning.

The base station 110, the terminal 120, and the terminal 130 may transmit and receive radio signals in a millimeter wave (mmWave) band (e.g., 28 GHz, 30 GHz, 38 GHz, 60 GHz). In so doing, to improve channel gain, the base station 110, the terminal 120, and the terminal 130 may conduct beamforming. Herein, the beamforming may include transmit beamforming and receive beamforming. That is, the base station 110, the terminal 120, and the terminal 130 may apply directivity to a transmit signal or a received signal. For doing so, the base station 110 and the terminals 120 and 130 may select serving beams 112, 113, 121, and 131 through a beam search or beam management procedure. After the serving beams 112, 113, 121, and 131 are selected, communications may be performed using resources which are quasi co-located (QCL) with resources which carry the serving beams 112, 113, 121, and 131.

If large-scale properties of a channel which carries a symbol on a first antenna port may be inferred from a channel which carries a symbol on a second antenna port, the first antenna port and the second antenna port may be said to be QCL. For example, the large-scale properties may include at least one of delay spread, Doppler spread, Doppler shift, average gain, average delay, and spatial receiver parameter.

The base station 110 and the terminal 120 or the terminal 130 in FIG. 1 transmit signals over the radio channel. For doing so, the base station 110 and the terminal 120 or the terminal 130 may include a transmitter for generating a radio frequency (RF) signal. The transmitter according to various embodiments may be configured as shown in FIG. 2.

Figure 2:
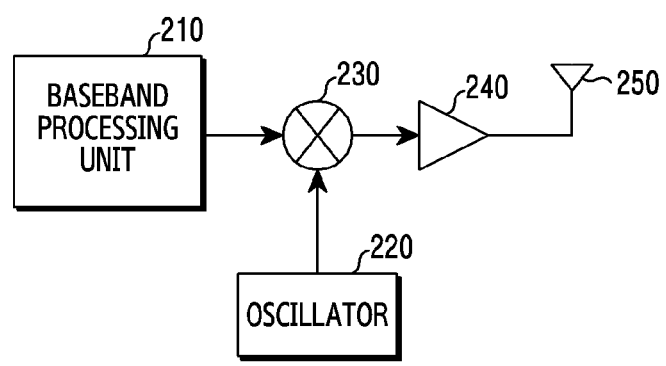
FIG. 2 illustrates a configuration of a transmitter in a wireless communication system according to various embodiments of the present disclosure.

FIG. 2 illustrates a configuration of a transmitter in a wireless communication system according to various embodiments of the present disclosure. FIG. 2 illustrates the transmitter included in the base station 110, the terminal 120 or the terminal 130.

Referring to FIG. 2, the transmitter includes a baseband processing unit 210, an oscillator 220, a mixer 230, an amplifier 240, and an antenna 250. The oscillator 220, the mixer 230, and the amplifier 240 may be collectively referred to as an RF circuit.

The baseband processing unit 210 performs various operations on a baseband signal, and controls RF circuits. For example, the baseband processing unit 210 may generate complex symbols by encoding and modulating a transmit bitstream according to a physical layer standard of the system. For doing so, the baseband processing unit 210 may include at least one processor for the operation and the control.

The oscillator 220 generates an oscillating signal, and provides the generated oscillating signal to the mixer 230. For doing so, the oscillator may include a phase locked loop (PLL). In FIG. 2, only one oscillator 220 is illustrated, but according to another embodiment, two or more oscillators for generating oscillating signals of different frequencies may be included. Alternatively, according to another embodiment, the oscillator 220 may provide oscillating signals of different frequencies to two or more mixers.

The mixer 230 up-converts a frequency of the transmit signal provided from the baseband processing unit 210 using the oscillating signal provided from the oscillator 220. Only one mixer 230 is illustrated in FIG. 2, but two or more mixers using oscillating signals of different frequencies may be included according to another embodiment. In addition, although not depicted in FIG. 2, according to another embodiment, a digital-analog converter (DAC) for converting a digital signal to an analog signal may be further included between the baseband processing unit 210 and the mixer 230.

The amplifier 240 amplifies power of the signal up-converted by the mixer 230. The antenna 250 radiates the signal amplified by the amplifier 240 over a radio channel. The antenna may be implemented with an antenna array including a plurality of antenna elements. In addition, although not depicted in FIG. 2, a circuit (e.g., phase shifters) for beamforming may be further included between the amplifier 240 and the antenna 250, according to another embodiment.

According to the example described in FIG. 2, the transmitter includes the single mixer and the single amplifier. However, according to another embodiment, two or more mixers or two or more amplifiers may be included. If two or more mixers are included, the oscillator 220 may provide oscillating signals of identical or different frequencies to the two or more mixers.

As shown in FIG. 2, the oscillating signal may be used for the up-conversion to the high frequency signal. In general, the oscillating signal is generated using a PLL. At this time, by changing a design of the PLL, the oscillator may directly generate the oscillating signal of its intended frequency. Alternatively, the oscillator may acquire an oscillating signal of a higher frequency, by multiplying the oscillating signal generated by the PLL. Hereinafter, an example of acquiring an oscillating signal of an intended frequency through multiplication will be described with reference to FIG. 3.

Figure 3:
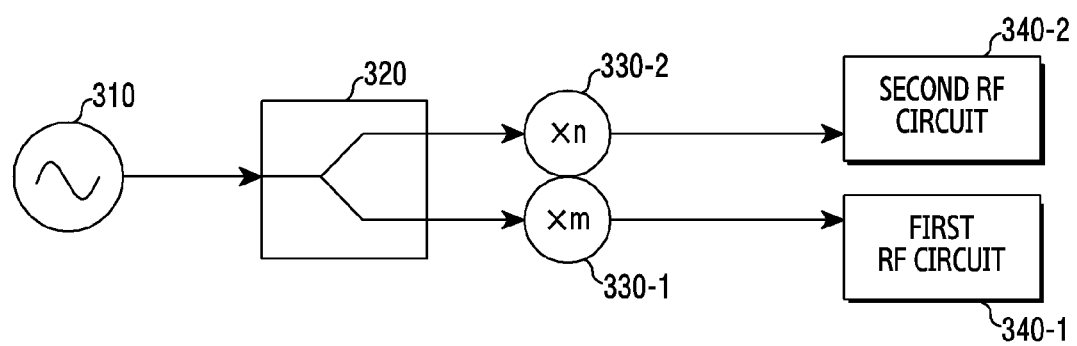
FIG. 3 illustrates an example of generating an oscillating signal using a frequency multiplier in a wireless communication system according to various embodiments of the present disclosure.

FIG. 3 illustrates an example of generating an oscillating signal using a frequency multiplier in a wireless communication system according to various embodiments of the present disclosure. FIG. 3 illustrates a case where two RF circuits use oscillating signals of different frequencies.

Referring to FIG. 3, a PLL 310 generates a base oscillating signal. For example, a frequency of the base oscillating signal may be 5.6 GHz. Next, the base oscillating signal is divided to two signals through a division circuit 320. For example, the division circuit 320 may be implemented with a coupler. The divided base oscillating signals are inputted to different frequency multipliers 330-1 and 330-2 respectively. In the example of FIG. 3, the first frequency multiplier 330-1 performs an m-times multiplication operation, and the second frequency multiplier 330-2 performs an n-times multiplication operation. For example, m may be 3, and n may be 4. In this case, if the frequency of the base oscillating signal is 5.6 GHz, the oscillating signal of 16.8 GHz may be generated by the first frequency multiplier 330-1, and the oscillating signal of 22.4 GHz may be generated by the second frequency multiplier 330-2. The oscillating signals generated by the first frequency multiplier 330-1 and the second frequency multiplier 330-2 are provided to a first RF circuit 340-1 and a second RF circuit 340-2 respectively.

As described in FIG. 3, even if the single PLL is used, oscillating signals of various frequencies may be generated through the multiplication operation. That is, the frequency multiplier may be used to generate oscillating signals of different frequencies as well as the oscillating signals of the intended frequency. That is, RF systems of various bands may be implemented using the frequency multiplier.

A frequency multiplier 430 is based on a method using a harmonic component generated by nonlinear characteristics of a semiconductor device. If an RF signal passes through a nonlinear device (e.g., a transistor, a diode, etc.), harmonic components having a frequency of n times the input frequency (n is an integer equal to or greater than 1) are generated. Thus, using the frequency multiplier, unintended signal components, that is, harmonic components may occur, as shown in FIG. 4.

Figure 4:
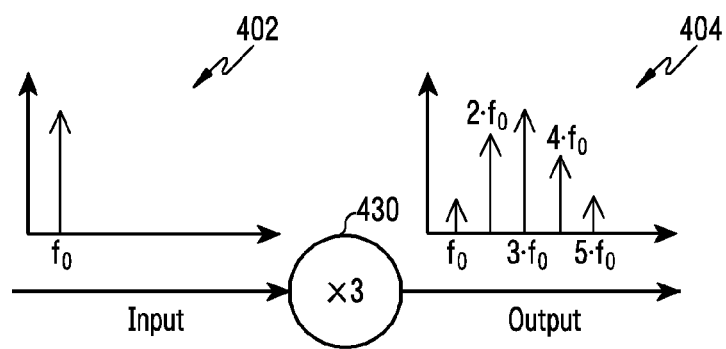
FIG. 4 illustrates an example of harmonic components generated by a frequency multiplier in a wireless communication system according to various embodiments of the present disclosure.

FIG. 4 illustrates an example of harmonic components generated by a frequency multiplier in a wireless communication system according to various embodiments of the present disclosure. Referring to FIG. 4, an input signal 420 has a frequency of $f_0$. The input signal 420 is inputted to a three-times frequency multiplier 430, and the frequency multiplier 430 generates an output signal 404 including a signal having the frequency of $3 \cdot f_0$. However, the output signal 404 may further include other harmonic components than the intended frequency component of $3 \cdot f_0$, that is, components of $f_0$, $2 \cdot f_0$, $4 \cdot f_0$, and $5 \cdot f_0$.

The harmonic components, which are the unintended signal, need to be removed. In general, the harmonic component may be removed using filtering characteristics of the output amplifier or by using a passive filter. However, the filtering scheme may not easily remove a harmonic component (e.g., the components $2 \cdot f_0$ and $4 \cdot f_0$ of FIG. 4) adjacent to an intended signal (e.g., the component $3 \cdot f_0$ of FIG. 4). In addition, since it is not easy to realize the filtering characteristics and wide-band characteristics at the same time, difficulty in implementing a wide-band frequency multiplier may increase. In other words, if the filter or the amplifier is designed in a narrow band for the removal of the adjacent harmonic component, it may be hard to expand the operating frequency range of the frequency multiplier.

Figure 5:
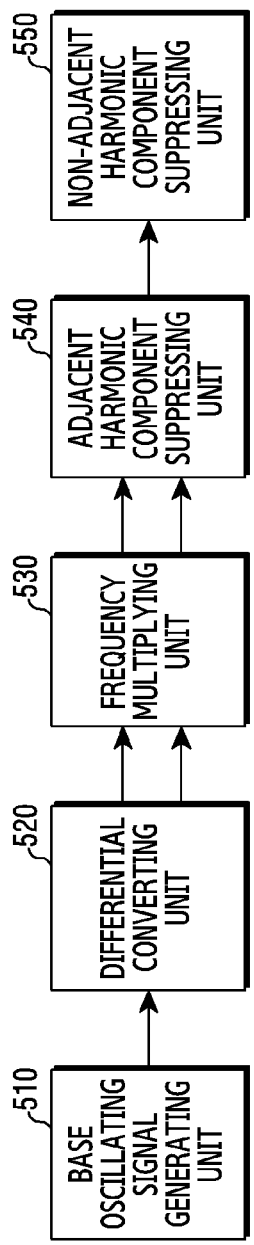
FIG. 5 illustrates a configuration of an oscillator in a wireless communication system according to various embodiments of the present disclosure.

Hence, the present disclosure suggests various embodiments for removing the adjacent harmonic component. The structure of the oscillator according to various embodiments is shown in FIG. 5. FIG. 5 illustrates a configuration of an oscillator in a wireless communication system according to various embodiments of the present disclosure. FIG. 5 may be understood as a configuration example of the oscillator 220. Names of components used in FIG. 5 are for the sake of understanding, and their names do not limit the scope of the invention.

Referring to FIG. 5, the oscillator includes a base oscillating signal generating unit 510, a differential converting unit 520, a frequency multiplying unit 530, an adjacent harmonic component suppressing unit 540, and a non-adjacent harmonic component suppressing unit 550.

The base oscillating signal generating unit 510 generates a base oscillating signal. The base oscillating signal is an oscillating signal before the frequency multiplication, and has a lower frequency than the oscillating signal required by the RF circuit. The base oscillating signal generating unit 510 may be implemented with a PLL.

The differential converting unit 520 converts the base oscillating signal to a differential signal. In other words, the differential converting unit 520 generates another signal having a phase difference 180° from the input signal, and outputs the input signal and the another signal. For example, the differential converting unit 520 may be implemented with at least one inductor. However, according to another embodiment, if the base oscillating signal is generated in the form of the differential signal, the differential converting unit 520 may be omitted.

The frequency multiplying unit 530 multiplies signals each constituting the differential signal. In other words, the frequency multiplying unit 530 generates signals of a higher frequency from each of the signals constituting the differential signal. For example, the frequency multiplying unit 530 may be implemented with at least one diode or at least one transistor.

The adjacent harmonic component suppressing unit 540 suppresses a harmonic component adjacent to an intended frequency component. For doing so, the adjacent harmonic component suppressing unit 540 may perform a linear operation (e.g., addition, subtraction, etc.) between the signals constituting the differential signal. At this time, details of the linear operation may vary according to a relation between the frequencies of the intended frequency component and the base oscillating signal. For example, the adjacent harmonic component suppressing unit 540 may be implemented with at least one inductor.

The non-adjacent harmonic component suppressing unit 550 suppresses a harmonic component not adjacent to the intended frequency component. For doing so, the non-adjacent harmonic component suppressing unit 550 may perform a filtering operation. For example, the non-adjacent harmonic component suppressing unit 550 may be implemented with a bandpass filter or an amplifier having filtering characteristics.

As described with reference to FIG. 5, the transmitter according to various embodiments may effectively suppress the adjacent harmonic component using properties of the differential signal. Specific embodiments of each component shown in FIG. 5 are described below by referring to FIG. 6 through FIG. 9.

Figure 6:
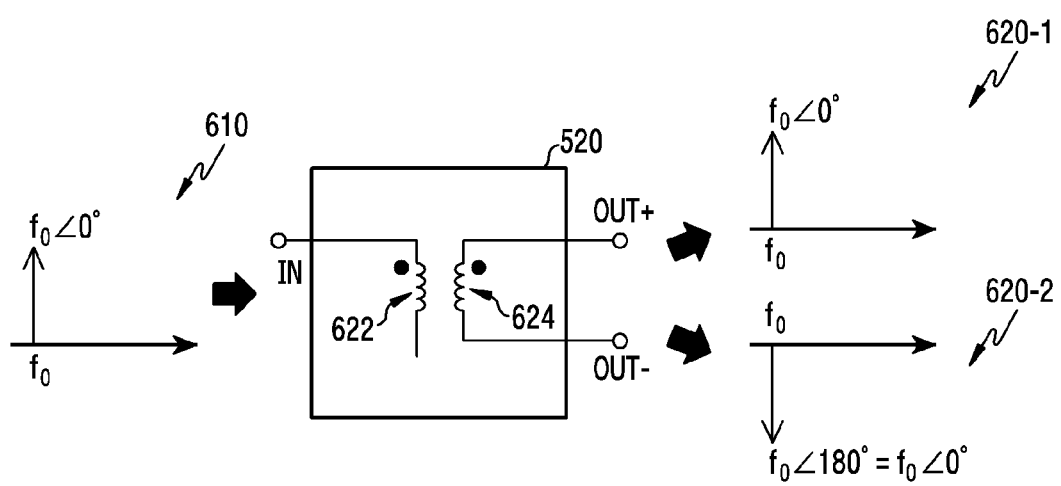
FIG. 6 illustrates an implementation example of a differential converter of an oscillator in a wireless communication system according to various embodiments of the present disclosure.

FIG. 6 illustrates an implementation example of a differential converting unit of an oscillator in a wireless communication system according to various embodiments of the present disclosure. Referring to FIG. 6, the differential converting unit 520 may be implemented with two inductors 622 and 624. If an input signal 610 having the frequency of $f_0$ passes through the first inductor 622, output signals 620-1 and 620-2 in the form of a differential signal are outputted to two output terminals through the second inductor 624.

Figure 7:
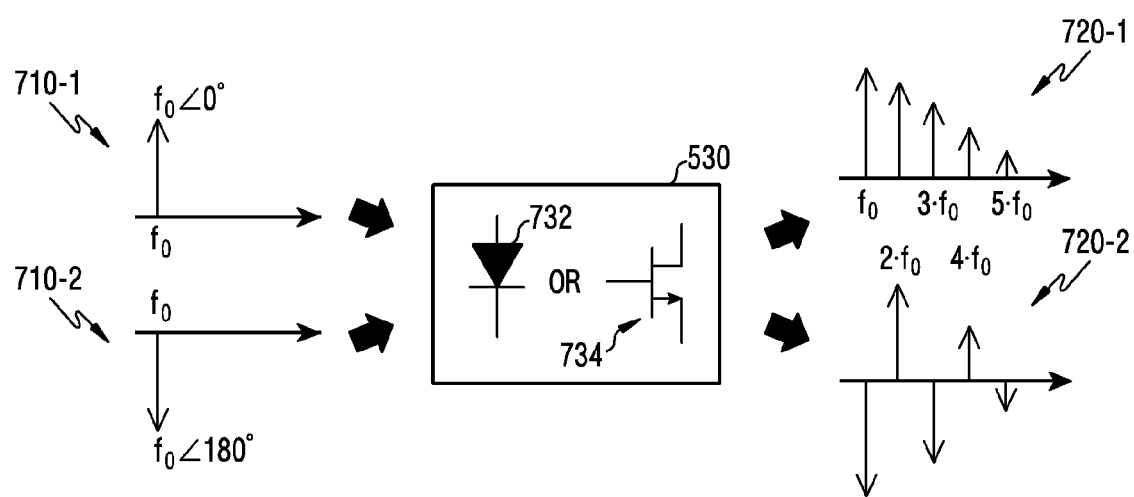
FIG. 7 illustrates an implementation example of a frequency multiplier of an oscillator in a wireless communication system according to various embodiments of the present disclosure.

FIG. 7 illustrates an implementation example of a frequency multiplying unit of an oscillator in a wireless communication system according to various embodiments of the present disclosure. Referring to FIG. 7, the frequency multiplying unit 530 may be implemented with a diode 732 or a transistor 734. If input signals 710-1 and 720-2 of a differential signal form are inputted, multiplied signals 720-1 and 720-2 corresponding to the input signals 710-1 and 720-2 respectively are outputted. That is, the output signals 720-1 and 720-2 including harmonic components of the input signals 710-1 and 720-2 respectively are generated. At this time, the components of the first output signal 720-1 generated from the first input signal 710-1 having a phase of 0° all have the + phase. However, some of the components of the second output signal 720-2 generated from the second input signal 710-2 having the phase of 180° have the + phase, and the rest has the + phase. Specifically, among the components of the second output signal 720-2, the odd components have the − phase based on the following <Equation 1>, and the even components have the + phase based on the following <Equation 2>.

$$(2n+1) \times f_0 \angle 180° = (2n+1) \cdot f_0 \angle (360n + 180°) \quad \text{⟨Equation 1⟩}$$
$$= (2n+1) \cdot f_0 \angle (360n + 180°)$$
$$= (2n+1) \cdot f_0 \angle 180°$$
$$= (2n+1) \cdot f_0 \angle 0°$$

$$(2n) \times f_0 \angle 180° = (2n) \cdot f_0 \angle (360n°) \quad \text{⟨Equation 2⟩}$$
$$= (2n) \cdot f_0 \angle (360n°)$$
$$= (2n) \cdot f_0 \angle 0°$$

In <Equation 1> and <Equation 2>, $f_0$ denotes the frequency of the base oscillating signal.

Figure 8A:
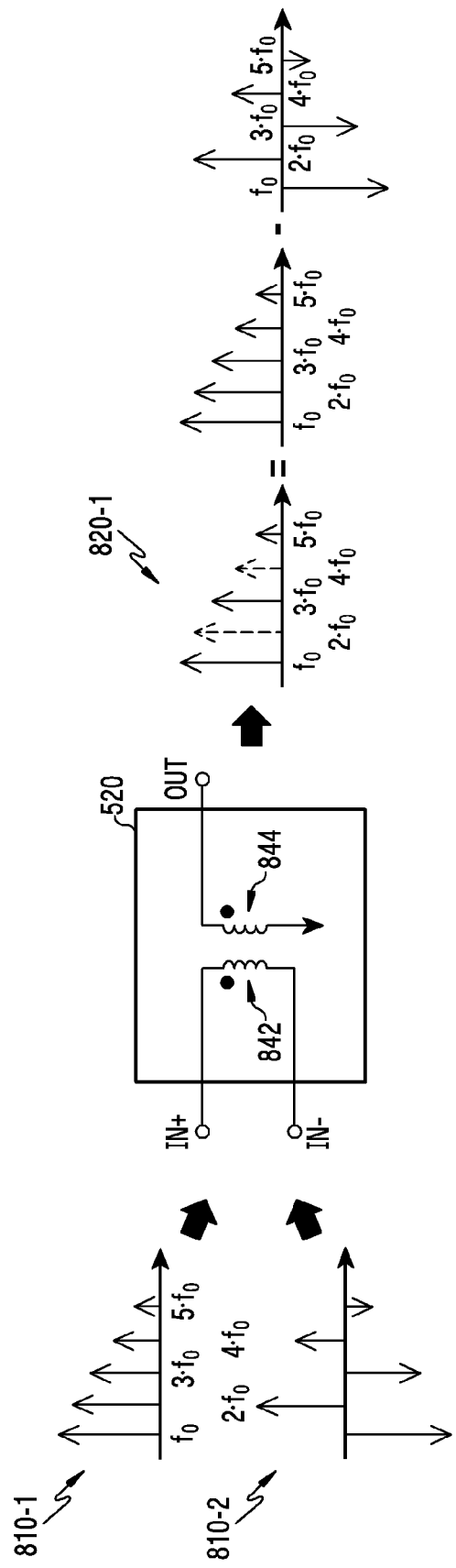
FIG. 8A and FIG. 8B illustrate implementation examples of an adjacent harmonic component suppressing unit of an oscillator in a wireless communication system according to various embodiments of the present disclosure.
Figure 8B:
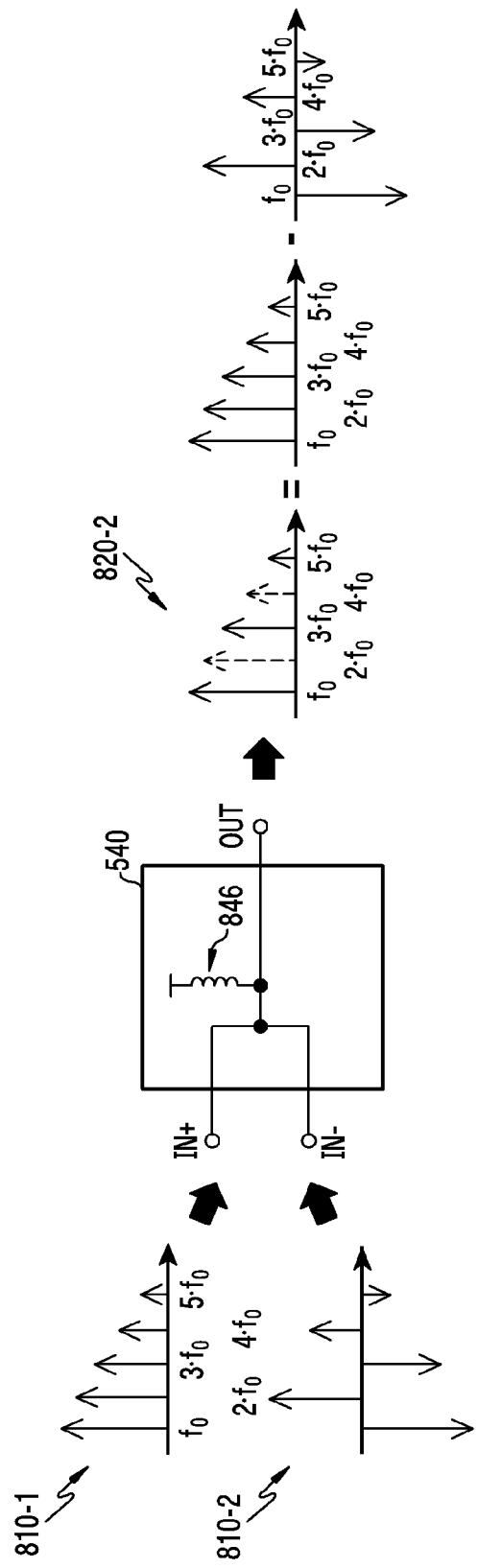

FIG. 8A and FIG. 8B illustrate implementation examples of an adjacent harmonic component suppressing unit of an oscillator in a wireless communication system according to various embodiments of the present disclosure. Referring to FIG. 8A and FIG. 8B, the adjacent harmonic component suppressing unit 540 may be implemented with at least one inductor 842, 844, or 846. FIG. 8A is the implementation example of the adjacent harmonic component suppressing unit 540 if an intended multiplication value is an odd number, and FIG. 8B is the implementation example of the adjacent harmonic component suppressing unit 540 if the intended multiplication value is an even number.

Referring to FIG. 8A, the adjacent harmonic component suppressing unit 540 may be implemented with the first inductor 842 and the second inductor 844. If input signals 810-1 and 820-2 of the multiplied differential signal pass through the first inductor 842 in different directions, the second inductor 844 generates an output signal 820-1 through subtraction between the input signals 810-1 and 820-2. As a result, even-numbered harmonic components are canceled. That is, the output signal 820-1 does not include the even-numbered harmonic components but includes only odd-numbered harmonic components.

Referring to FIG. 8B, the adjacent harmonic component suppressing unit 540 may be implemented with the inductor 846. If the input signals 810-1 and 820-2 of the multiplied differential signal are inputted to the same end of the inductor 846, an output signal 820-2 is generated by adding the input signals 810-1 and 820-2. As a result, odd-numbered harmonic components are canceled. That is, the output signal 820-2 does not include the odd-numbered harmonic components but includes only the even-numbered harmonic components.

Figure 9:
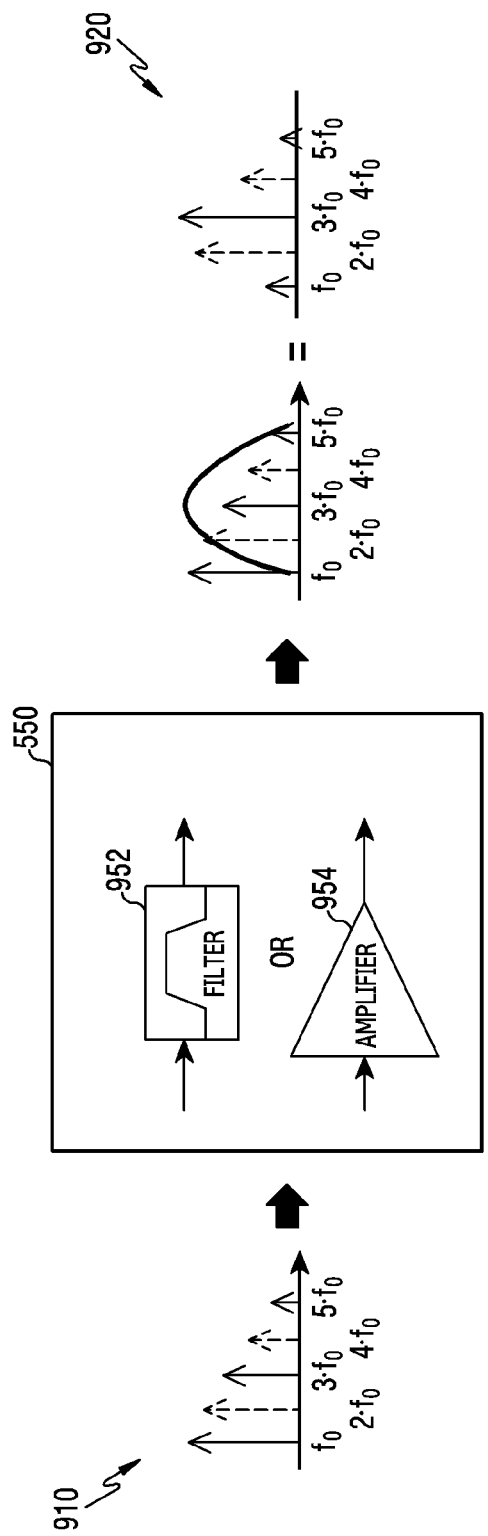
FIG. 9 illustrates an implementation example of a non-adjacent harmonic component suppressing unit of an oscillator in a wireless communication system according to various embodiments of the present disclosure.

FIG. 9 illustrates an implementation of a non-adjacent harmonic component suppression unit of an oscillator in a wireless communication system according to various embodiments of the present disclosure. FIG. 9 illustrates a case in which an intended multiplication value is 3. Referring to FIG. 9, the non-adjacent harmonic component suppressing unit 550 may be implemented with a filter 952 or an amplifier 954. If an input signal 910 including odd-numbered harmonic components passes through the filter 952 or the amplifier 954, the component $3 \cdot f_0$ is passed and the remaining non-adjacent components $f_0$ and $5 \cdot f_0$ are reduced in size. Thus, an output signal 920 of the dominant component $3 \cdot f_0$ may be obtained.

According to the various embodiments described above, a high frequency oscillator according to the frequency multiplication method may be configured. Implementations according to the various embodiments as mentioned above may be selectively combined, and examples of two combinations are now be described in FIG. 10A and FIG. 10B.

Figure 10A:
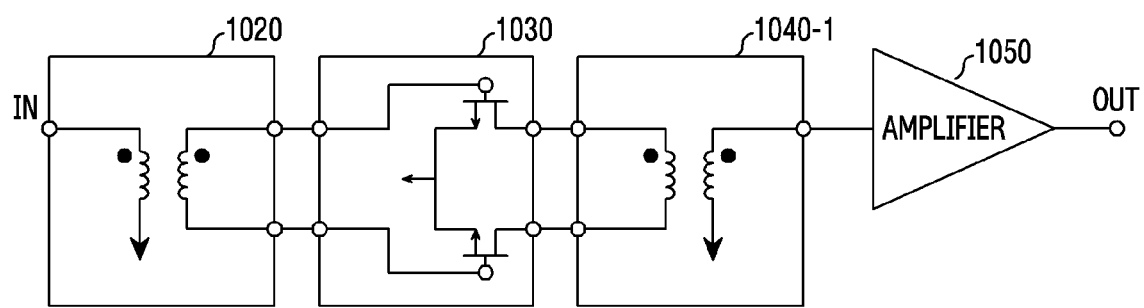
FIG. 10A and FIG. 10B illustrate implementation examples of an oscillator in a wireless communication system according to various embodiments of the present disclosure.
Figure 10B:
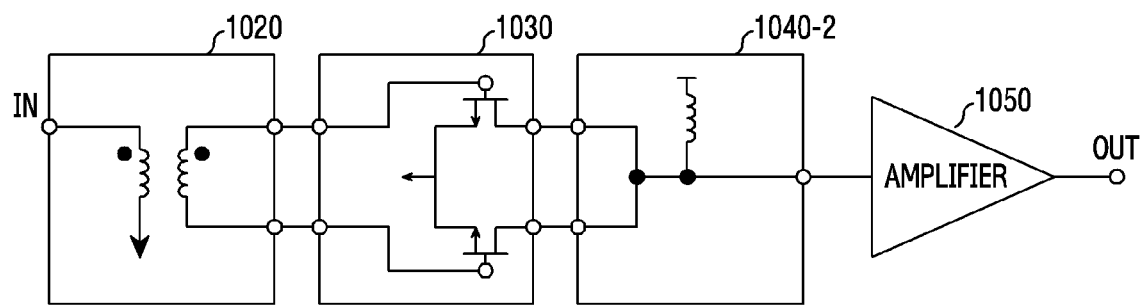

FIG. 10A and FIG. 10B illustrate implementation examples of an oscillator in a wireless communication system according to various embodiments. FIG. 10A shows the example of removing non-adjacent harmonic components with filtering characteristics of an amplifier if an intended multiplication value is odd, and FIG. 10A shows the example of removing the non-adjacent harmonic components with the filtering characteristics of the amplifier if the intended multiplication value is even.

Referring to FIG. 10A, a differential converting unit 1020 may be implemented with two inductors, a frequency multiplying unit 1030 may implemented with two transistors, an adjacent harmonic component suppressing unit 1040-1 may be implemented with two inductors for the subtraction operation, and a non-adjacent harmonic component suppressing unit 1050 may be implemented with an amplifier. Referring to FIG. 10B, the differential converting unit 1020 may be implemented with two inductors, the frequency multiplying unit 1030 may be implemented with two transistors, the adjacent harmonic component suppressing unit 1040-2 may be implemented with one inductor for the addition operation, and the non-adjacent harmonic component suppressing unit 1050 may be implemented with an amplifier.

Figure 11:
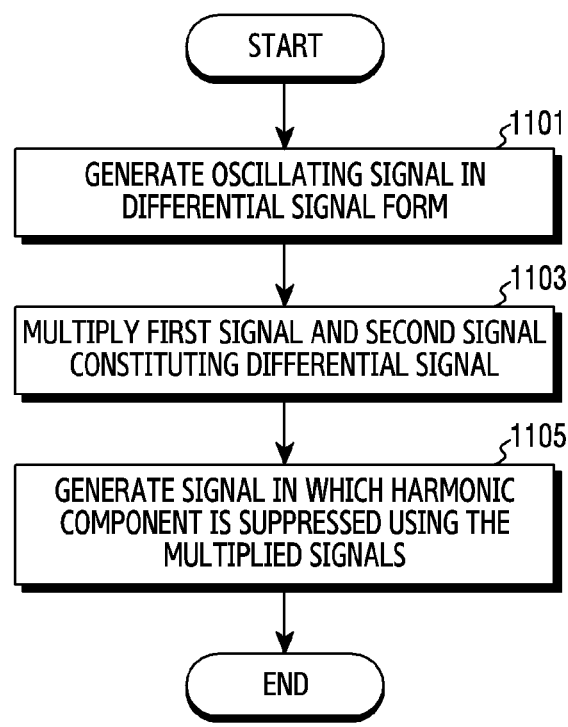
FIG. 11 illustrates a flowchart of a transmitter in a wireless communication system according to various embodiments of the present disclosure.

FIG. 11 illustrates a flowchart of a transmitter in a wireless communication system according to various embodiments. FIG. 11 illustrates an operating method of the transmitter including the oscillator 220. According to various perspectives, FIG. 11 may be understood as an operating method of the oscillator 220.

Referring to FIG. 11, in step 1101, the transmitter generates an oscillating signal in the form of a differential signal. For example, the transmitter may generate the oscillating signal using a PLL, and convert the oscillating signal to a differential signal. Yet, if the oscillating signal generated by the PLL has the form of the differential signal, the operation of converting a single signal into a differential signal may be omitted. Hence, a first signal and a second signal having a phase difference 180° may be generated.

In step 1103, the transmitter multiplies the first signal and the second signal constituting the differential signal. That is, by multiplying the first signal and the second signal, the transmitter generates a first signal set including harmonic components of the first signal and a second signal set including harmonic components of the second signal. In so doing, the components of the first signal set all may have the + phase, some of the components of the second signal set may have the + phase, and the rest may have the − phase.

In step 1105, the transmitter generates a signal in which at least one harmonic component adjacent to the intended frequency component is suppressed using the multiplied signals. Specifically, the transmitter linearly operates the multiplied signals. According to various embodiments, the transmitter performs the addition or subtraction operation on the first signal and the second signal, and thus suppresses at least one harmonic component adjacent to the component corresponding to the intended multiplication value. At this time, an appropriate weight may be applied to the first signal or the second signal. For example, if the intended multiplication value is odd, the transmitter may perform the subtraction operation. As another example, if the intended multiplication value is even, the transmitter may perform the addition operation.

Next, although not depicted in FIG. 11, the transmitter may suppress at least one non-adjacent harmonic component. For doing so, the transmitter may use the filtering characteristics of the amplifier, or may use a separate bandpass filter. The oscillating signal of the intended frequency is provided to the RF circuit, and may be used for frequency conversion of a transmit signal.

According to the various embodiments as stated above, adjacent harmonic components which are difficult to remove in using the frequency multiplier may be effectively suppressed. Herein, suppressing embraces not only removing the value but also reducing it to a size smaller than a specific threshold. Although the output filter or the amplifier is not designed in a narrowband to attain good filtering characteristics, the oscillation technique according to various embodiments helps to expand the operating frequency range of the frequency multiplier. As a result, unnecessary harmonic components due to the frequency multiplier are suppressed, and thus burden on designing the entire system may be greatly reduced.

The methods according to the embodiments described in the claims or the specification of the disclosure may be implemented in software, hardware, or a combination of hardware and software.

As for the software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods according to the embodiments described in the claims or the specification of the disclosure.

Such a program (software module, software) may be stored to a random access memory, a non-volatile memory including a flash memory, a read only memory (ROM), an electrically erasable programmable ROM (EEPROM), a magnetic disc storage device, a compact disc (CD)-ROM, digital versatile discs (DVDs) or other optical storage devices, and a magnetic cassette. Alternatively, it may be stored to a memory combining part or all of those recording media. A plurality of memories may be included.

Also, the program may be stored in an attachable storage device accessible via a communication network such as Internet, Intranet, local area network (LAN), wide LAN (WLAN), or storage area network (SAN), or a communication network by combining these networks. Such a storage device may access a device which executes an embodiment of the present disclosure through an external port. In addition, a separate storage device on the communication network may access the device which executes an embodiment of the present disclosure.

In the specific embodiments of the disclosure, the elements included in the disclosure are expressed in a singular or plural form. However, the singular or plural expression is appropriately selected according to a proposed situation for the convenience of explanation, the disclosure is not limited to a single element or a plurality of elements, the elements expressed in the plural form may be configured as a single element, and the elements expressed in the singular form may be configured as a plurality of elements.

Meanwhile, while the specific embodiment has been described in the explanations of the present disclosure, it will be noted that various changes may be made therein without departing from the scope of the disclosure. Thus, the scope of the disclosure is not limited and defined by the described embodiment and is defined not only the scope of the claims as below but also their equivalents.

The invention claimed is:

1. An apparatus of a transmitter in a wireless communication system, comprising:
   an oscillating circuit for providing an oscillating signal; and
   a radio frequency (RF) circuit configured to:
      convert a frequency of a transmit signal using the oscillating signal; and
      transmit the transmit signal,
   wherein the oscillating circuit is configured to:
      generate a differential signal based on a base oscillating signal, the differential signal comprising a first signal and a second signal,
      generate a first signal set by using a multiplication of the first signal and generate a second signal set by using multiplication of the second signal,
      if an intended multiplication value for the frequency is an even number, generate a first suppressed signal by using a first circuit, the first circuit including a transformer for adding the first signal set and the second signal set, and
      if the intended multiplication value for the frequency is an odd number, generate a second suppressed signal by using a second circuit, the second circuit including at least one inductor for subtracting from the first signal set to the second signal set,
   wherein each of the first suppressed signal and the second suppressed signal is a suppressed at least one harmonic component adjacent to the frequency.

2. The apparatus of claim 1, wherein the oscillating circuit is configured to:
   generate the oscillating signal by suppressing at least one harmonic component not adjacent in the first suppressed signal or the second suppressed signal.

3. The apparatus of claim 2, wherein the at least one harmonic component not adjacent is suppressed using filtering characteristics of an amplifier or a bandpass filter.

4. The apparatus of claim 1, wherein the base oscillating signal comprises an output of a phase locked loop (PLL).

5. The apparatus of claim 1, wherein the first suppressed signal is generated if the first signal set and the second signal set are passed through the first circuit in different directions each other, and
   wherein the first suppressed signal includes odd-numbered harmonic components.

6. The apparatus of claim 1, wherein the second suppressed signal is generated if the first signal set and the second signal set are inputted on a same end of the second circuit, and
   wherein the second suppressed signal includes even-numbered harmonic components.

7. The apparatus of claim 1, wherein the first signal set includes harmonic components of the first signal, the harmonic components of the first signal having positive phase, and
   wherein the second signal set includes harmonic components of the second signal, the harmonic components of the second signal having both positive phase and negative phase.

8. An operating method of a transmitter in a wireless communication system, comprising:
   generating a differential signal based on a base oscillating signal, the differential signal comprising a first signal and a second signal;
   generating a first signal set by using a multiplication of the first signal and generating a second signal set by using a multiplication of the second signals;
   if an intended multiplication value for a frequency is an even number, generating a first suppressed signal by using a first circuit, the first circuit including a transformer for adding the first signal set and the second signal set;
   if the intended multiplication value for the frequency is an odd number, generating a second suppressed signal by using a second circuit, the second circuit including at least one inductor for subtracting from the first signal set to the second signal set;
   converting the frequency of a transmit signal using an oscillating signal; and
   transmitting the transmit signal,
   wherein each of the first suppressed signal and the second suppressed signal is a suppressed at least one harmonic component adjacent to the frequency.

9. The method of claim 8, further comprising:
   generating the oscillating signal by suppressing at least one harmonic component not adjacent in the first suppressed signal or the second suppressed signal.

10. The method of claim 9, wherein the at least one harmonic component not adjacent is suppressed using filtering characteristics of an amplifier or a bandpass filter.

11. The method of claim 8, wherein the base oscillating signal comprises an output of a phase locked loop (PLL).

* * * * *